(12) United States Patent
Matsuura

(10) Patent No.: US 7,572,558 B2
(45) Date of Patent: Aug. 11, 2009

(54) PHOTOMASK AND EXPOSURE METHOD

(75) Inventor: Seiji Matsuura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 314 days.

(21) Appl. No.: 11/714,819

(22) Filed: Mar. 7, 2007

(65) Prior Publication Data

US 2007/0212617 A1  Sep. 13, 2007

(30) Foreign Application Priority Data

Mar. 8, 2006  (JP) .............................. 2006-062994

(51) Int. Cl.
*G03F 1/00* (2006.01)

(52) U.S. Cl. ......................................................... 430/5

(58) Field of Classification Search .................. 430/5, 430/311, 394; 716/19, 20, 21
See application file for complete search history.

(56) References Cited

U.S. PATENT DOCUMENTS 7,246,342 B2 * 7/2007 Hsu et al. ..................... 716/19

2004/0166422 A1  8/2004  Yamazoe et al.

FOREIGN PATENT DOCUMENTS

JP  11-135402  5/1999

* cited by examiner

*Primary Examiner*—Stephen Rosasco
(74) *Attorney, Agent, or Firm*—McGinn IP Law Group, PLLC

(57) ABSTRACT

A photomask is to be used for exposure of a semiconductor wafer with the dipole illumination light, and includes a main opening, a first assist opening, a second assist opening, a third assist opening and a fourth assist opening. Each of the assist openings is located so that the central point thereof is deviated from both of a first straight line parallel to a first direction and passing the central point of the main opening, and a second straight line parallel to a second direction and passing the central point of the main opening. Here, the first direction is the direction among in-plane directions of the photomask that is parallel to an alignment direction of an effective light source distribution of the dipole illumination light. Also, the second direction is the direction among in-plane directions of the photomask that is perpendicular to the alignment direction.

6 Claims, 16 Drawing Sheets

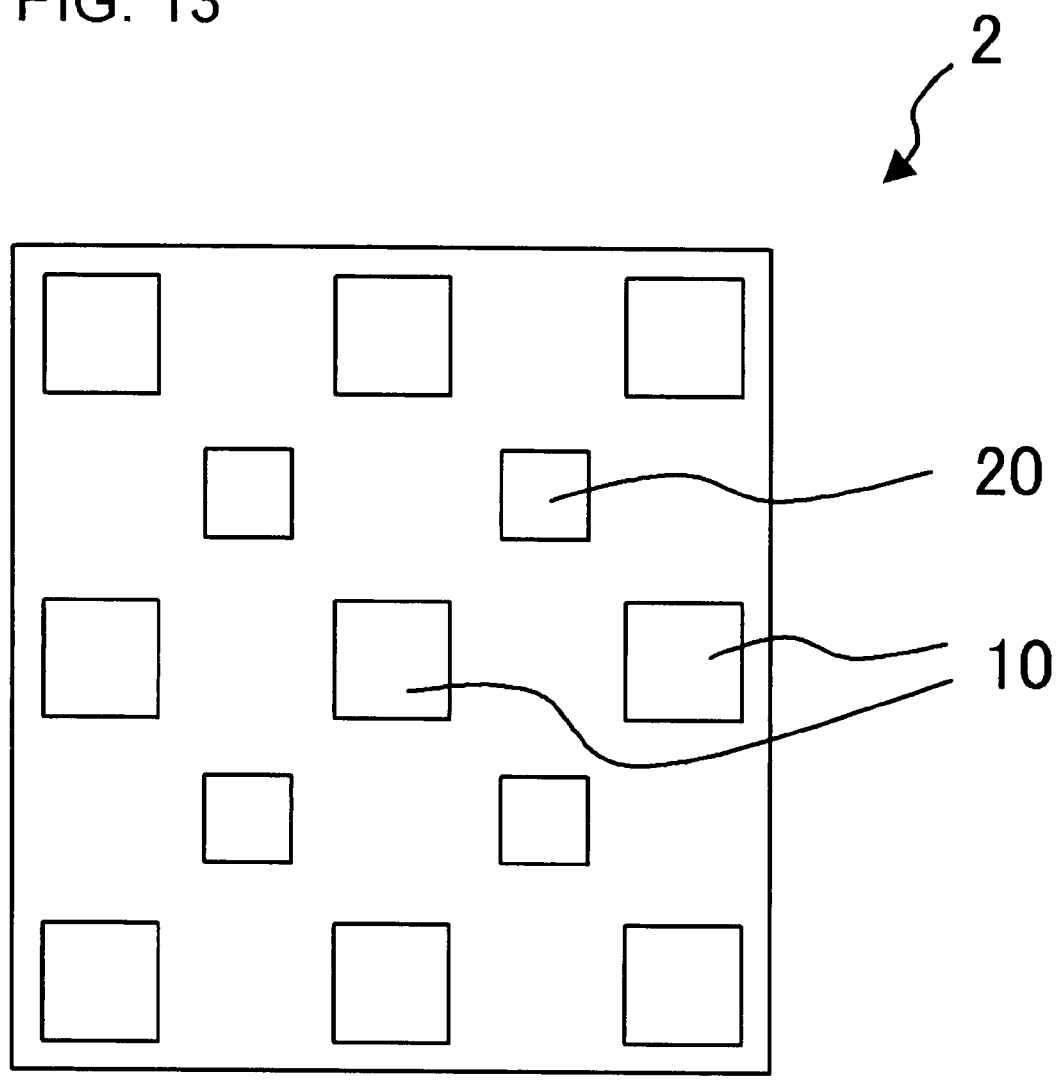

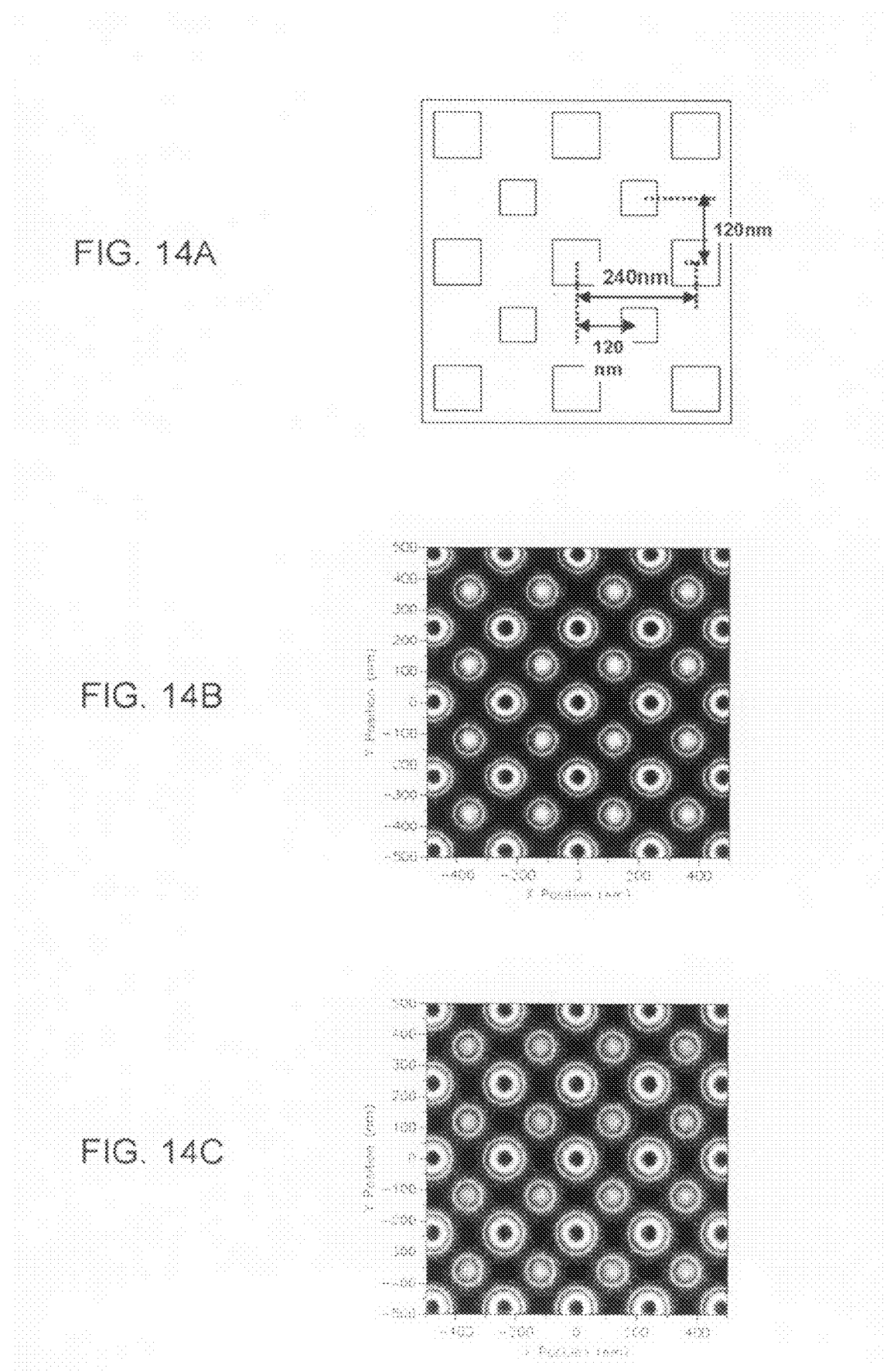

PHOTOMASK AND EXPOSURE METHOD

This application is based on Japanese patent application No. 2006-062994, the content of which is incorporated hereinto by reference.

BACKGROUND

1. Technical Field

The present invention relates to a photomask, and to an exposure method that employs the photomask.

2. Related Art

An example of photomasks so far developed can be found in Japanese Laid-open patent publication No. H11-135402 (patent document 1). The photomask disclosed therein includes assist openings (opening features), in addition to a main opening. Here, the main opening refers to a transparent pattern provided so as to correspond to a predetermined opening pattern to be formed on a photoresist film over a semiconductor wafer, thus to be transferred thereto. The assist opening refers to a transparent pattern provided around the main opening, but not to be transferred to the photoresist film over a semiconductor wafer. The assist openings are aligned in a square grid pattern along with the main opening.

SUMMARY OF THE INVENTION

Providing thus the assist openings around the main opening allows increasing resolution when a photoresist film over the semiconductor wafer is exposed through the photomask. However, utilizing the photomask according to the patent document 1 for exposure with dipole illumination light results in extremely low resolution at a specific direction. This often causes the patterns adjacently laid out along that direction to be short-circuited over the semiconductor wafer.

According to the present invention, there is provided a photomask to be used for exposure of a semiconductor wafer with dipole illumination light, including: a main opening provided so as to correspond to a predetermined pattern to be formed on a photoresist film over the semiconductor wafer and to be transferred to a photoresist film over the semiconductor wafer; and an assist opening provided around the main opening but not to be transferred to the photoresist film over the semiconductor wafer; wherein, when a direction among in-plane directions of the photomask that is parallel and vertical to an alignment direction of an effective light source distribution of the dipole illumination light is respectively defined as a first and a second direction, the assist opening is located so that a central point of the assist opening is deviated from both of a first straight line parallel to the first direction and passing a central point of the main opening and a second straight line parallel to the second direction and passing the central point of the main opening.

In this photomask, the central point of the assist opening is deviated from both of the first and the second straight line. In case where, on the contrary, the central point of the assist opening falls on the first straight line, the resolution at the second direction is extremely degraded. Also, in case where the central point of the assist opening falls on the second straight line, the resolution at the first direction is extremely degraded. Locating the assist opening so that the central point is deviated from both of the first and the second straight line, therefore, prevents the extreme degradation in resolution at a specific direction.

Here, the central point of the main opening is defined as the center of gravity on the assumption that the main opening has a certain mass. For example, when the main opening is of a rectangular shape, the central point coincides with the intersection of the two diagonal lines. When the main opening is circular, the central point coincides with the center of the circle. This also applies to the central point of the assist opening.

According to the present invention, there is also provided a photography method of exposing a semiconductor wafer with dipole illumination light through the foregoing photomask. Because of employing the above photomask, this exposure method prevents the extreme resolution loss along a specific direction within the wafer surface plane.

Thus, the present invention provides a photomask and an exposure method that can prevent extreme resolution loss along a specific direction within the wafer surface plane.

BRIEF DESCRIPTION OF THE DRAWINGS

The above and other objects, advantages and features of the present invention will be more apparent from the following description taken in conjunction with the accompanying drawings, in which:

FIG. 13 is a plan view showing a photomask according to the second embodiment of the present invention;

FIG. 14A is a plan view showing a photomask according to the second working example of the present invention;

FIG. 14B is a graphic diagram showing a result of aerial image simulation utilizing the dipole illumination light, with respect to the photomask shown in FIG. 14A;

FIG. 14C is a graphic diagram showing a result of the aerial image simulation utilizing the annular illumination light, with respect to the photomask shown in FIG. 14A;

DETAILED DESCRIPTION

Figure 1:
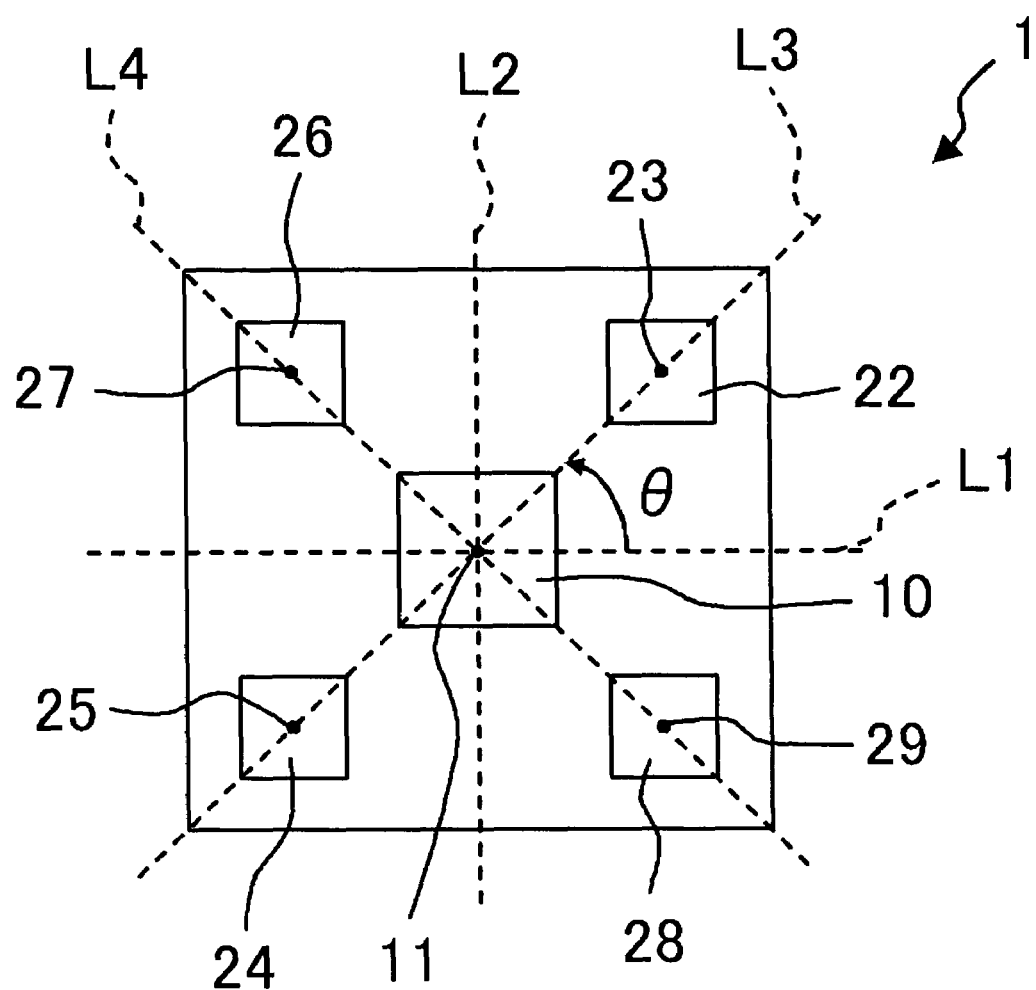
FIG. 1 is a plan view showing a photomask according to the first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a photomask and an exposure method according to the present invention will be described in details, referring to the accompanying drawings. In the drawings, same constituents are given the same numerals, and the description thereof will not be repeated.

First Embodiment

FIG. 1 is a plan view showing a photomask according to the first embodiment of the present invention. The photomask 1 is to be used for exposure of a semiconductor wafer with dipole illumination light, and includes a main opening 10, and an assist opening 22 (first assist opening), an assist opening 24 (second assist opening), an assist opening 26 (third assist opening) and an assist opening 28 (fourth assist opening).

The main opening 10 is provided so as to correspond to a predetermined pattern to be formed on the semiconductor wafer, thus to be transferred to the semiconductor wafer. In this embodiment, the pattern is a hole pattern. The assist openings 22, 24, 26, 28 are located around the main opening 10, and are not to be transferred to the semiconductor wafer. To be more detailed, the assist openings 22, 24, 26, 28 are smaller in opening area than the main opening 10, and transmit a light beam not sufficiently intense to transfer the assist opening in the exposure process. The opening area of the assist openings 22, 24, 26, 28 may be, for example, approximately 50 to 80% of that of the main opening 10. In this embodiment, the main opening 10 and the assist openings 22, 24, 26, 28 are all rectangular, and more specifically, square.

The assist openings 22, 24, 26, 28 are respectively located so that the central points 23, 25, 27, 29 are deviated from both of a straight line L1 (first straight line) that is parallel to a first direction and passes the central point 11 of the main opening 10, and a straight line L2 (second straight line) that is parallel to a second direction and passes the central point 11.

Here, the first direction is the direction among in-plane directions of the photomask 1 that is parallel to an alignment direction of an effective light source distribution of the dipole illumination light (horizontal direction in FIG. 1). Also, the second direction is the direction among in-plane directions of the photomask 1 that is perpendicular to the alignment direction (vertical direction in FIG. 1). In this embodiment, the first and the second direction are parallel to one of the four sides of the main opening 10 (four sides of the respective assist openings 22, 24, 26, 28). The alignment direction of an effective light source distribution of the dipole illumination light can be paraphrased as a direction parallel to a line connecting two intensity peaks of the dipole illumination light immediately before being incident on the photomask 1.

Also, the central point 11 of the main opening 10 is defined as the center of gravity on the assumption that the main opening 10 has a certain mass. In this embodiment, since the main opening 10 is of a rectangular shape, the central point 11 coincides with the intersection of the two diagonal lines. This also applies to the central points 23, 25, 27, 29 of the respective assist openings 22, 24, 26, 28. As a matter of course, the central points 11, 23, 25, 27, 29 are imaginary points, though those are visibly indicated in FIG. 1.

The location of the assist openings 22, 24, 26, 28 will be described in further details. The assist openings 22, 24, 26, 28 are located on a straight line L3 (third straight line) that is parallel to a third direction and passes the central point 11 of the main opening 10, or on a straight line L4 (fourth straight line) that is parallel to a fourth direction and passes the central point 11. More specifically, the assist opening 22 and the assist opening 24 are located on the straight line L3 so as to oppose each other across the central point 11, and the assist opening 26 and the assist opening 28 are located on the straight line L4 so as to oppose each other across the central point 11. In this embodiment in particular, the central point 23 of the assist opening 22 and the central point 25 of the assist opening 24 fall on the straight line L3, and the central point 27 of the assist opening 26 and the central point 29 of the assist opening 28 fall on the straight line L4.

Here, the third and the fourth direction are directions among in-plane directions of the photomask 1 that define 45° and 135° respectively, with respect to the alignment direction of the effective light source distribution of the dipole illumination light. A direction parallel to a straight line obtained upon rotating the straight line L1 by an angle $\theta$ ($0 \leq \theta < 180°$) counterclockwise around the central point 11 in the plane of the photomask 1 is the direction that defines the angle $\theta$ (Ref. FIG. 1). The foregoing first and the second straight line correspond to the case where $\theta$ is 0° and 90°, respectively.

The first embodiment of the exposure method according to the present invention represents the case of irradiating the semiconductor wafer with the dipole illumination light through such photomask 1.

This embodiment offers the following advantageous effects. In the photomask 1, all of the central points 23, 25, 27, 29 of the assist openings 22, 24, 26, 28 are deviated from both of the straight line L1 and the straight line L2. In case where, on the contrary, any of the central points 23, 25, 27, 29 is on the straight line L1, the resolution at the second direction is extremely degraded. Likewise, in case where any of the central points 23, 25, 27, 29 is on the straight line L2, the resolution at the first direction is extremely degraded.

Figure 16A:
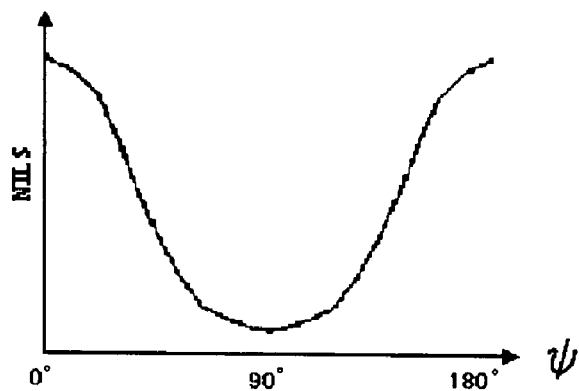
FIGS. 16A to 16D are graphs for explaining the effect of the embodiments.
Figure 16B:
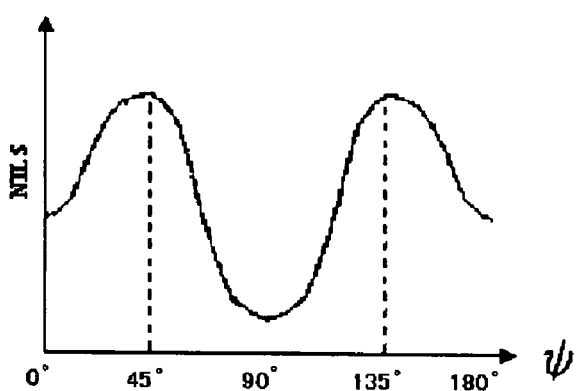
Figure 16C:
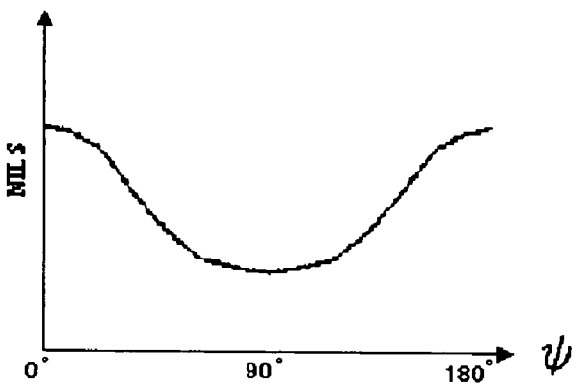
Figure 16D:
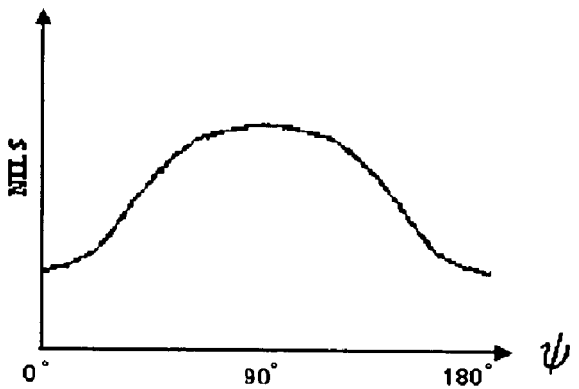

To explain the foregoing point, it will be assumed that the straight line L1 and a straight line that passes the central points of both of the assist opening and the main opening define an angle ψ (0≦ψ<180°). The angle ψ is to be taken in the same manner as the angle θ. Now, FIGS. 16A to 16D are graphs showing a relationship between a Normalized Image Log-Slope (hereinafter, NILS) and ψ. The NILS is a value obtained by multiplying a slope of fluctuation in dimension with respect to a shift of a threshold position (corresponding to variation in exposure amount) by a line width. The higher the NILS is, the higher resolution can be attained. FIGS. 16A and 16B represent the cases where an asymmetric illumination, typically the dipole illumination, is employed, while FIGS. 16C and 16D represent the cases where a symmetrical illumination, typically the annular illumination, is employed. Also, FIGS. 16A and 16C show the NILS of the first direction, and FIGS. 16B and 16D show the NILS of the second direction.

As is apparent from FIGS. 16A and 16B, in the case of employing the dipole illumination, the resolution at the first direction monotonously decreases and the resolution at the second direction monotonously increases, as the angle ψ increases from 0° to 45°. As ψ further increases from 45° to 90°, the resolution at both of the first and the second direction monotonously decreases. Further, while ψ decreases from 180° to 90°, the resolution at the first and the second direction presents a similar tendency to the above. Accordingly, while the angle ψ changes in the range of 0≦ψ<180°, the resolution at the second direction becomes a minimal value at ψ=0°, 90° or 180°, and the resolution at the first direction becomes a minimal value at ψ=90.

The foregoing explains why locating the assist opening so that the central point is deviated from both of the first and the second straight line can keep the resolution at a specific direction from being extremely degraded. In other words, the resolution at a direction where the resolution becomes a minimal value can be increased, and hence the fluctuation in resolution depending on the direction can be reduced. Achieving thus equilibrated resolution at different directions is a great advantage especially in the exposure of the hole pattern.

Also, the assist openings 22, 24, 26, 28 are located on the straight line L3 or the straight line L4. Such locations correspond to the case where the angle ψ is close to 45° or 135°. Since the resolution at the first direction and the resolution at the second direction come closest to each other at such points, the location according to this embodiment is optimal for achieving the well-balanced resolution at both directions.

The assist openings in the photomask 1 include the assist opening 22 and the assist opening 24 located on the straight line L3 so as to oppose each other across the central point 11, and the assist opening 26 and the assist opening 28 located on the straight line L4 so as to oppose each other across the central point 11. Locating thus a plurality of assist openings around the main opening 10 in a symmetrical pattern enhances the foregoing effect of achieving the well-balanced resolution.

The exposure method of this embodiment employs the photomask 1. Such method, therefore, prevents the extreme degradation in resolution at a specific direction.

Figure 2A:
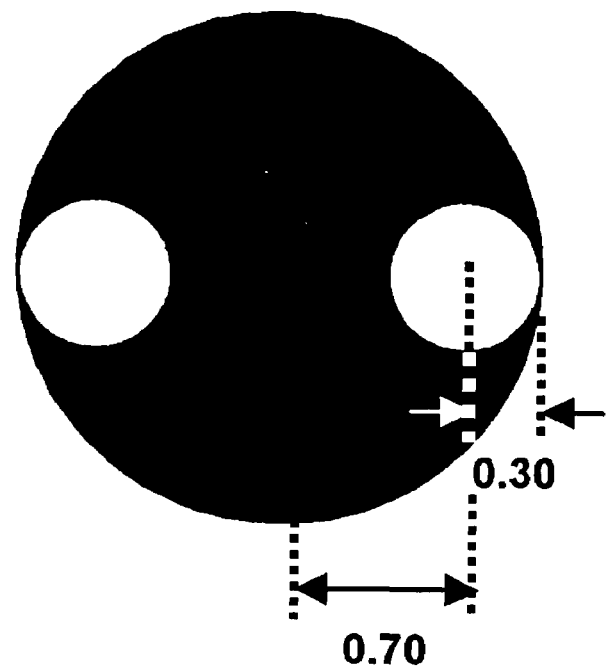
FIGS. 2A and 2B are plan views respectively showing a dipole illumination light source and an annular illumination light source utilized for simulation.
Figure 2B:
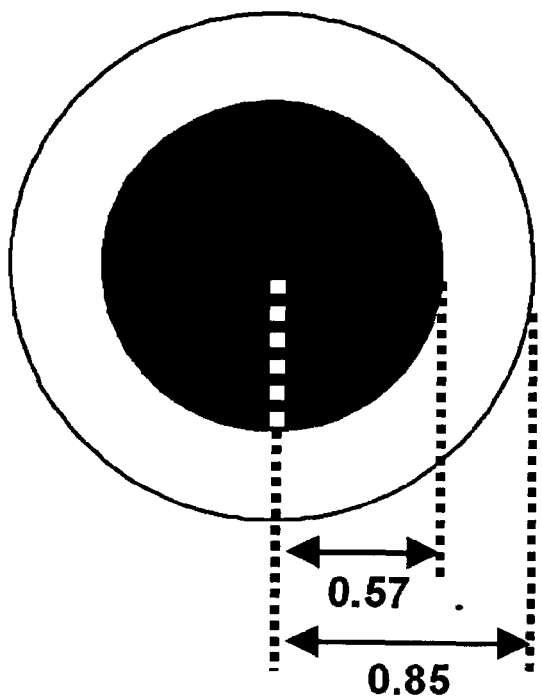

Referring now to FIGS. 2A through 8B, results of simulation performed to prove the effects of this embodiment will be described. FIGS. 2A and 2B are plan views showing light sources employed in this simulation. The former illustrates a dipole illumination light source, and the latter an annular illumination light source. As shown in FIG. 2A, openings of the dipole illumination light source are of a circular shape with a radius of 0.30. A distance from the center point between the two openings to the central point of the respective opening (equivalent to ½ of the distance between the central points of the two openings) is 0.70. In turn as shown in FIG. 2B, the inner and outer diameter of the annular illumination light source are 0.57 and 0.85, respectively. In this simulation an isolated hole of 70 nm was exposed through a binary mask with illumination light of 157 nm in wavelength, and 0.8 in numerical aperture (NA). The dimensions such as the size of patterns and the distance between patterns are represented in this document as the dimensions transmitted on the wafer in order to simplify explanations, although the mask pattern size are different from the one transmitted on the wafer.

Figure 3A:
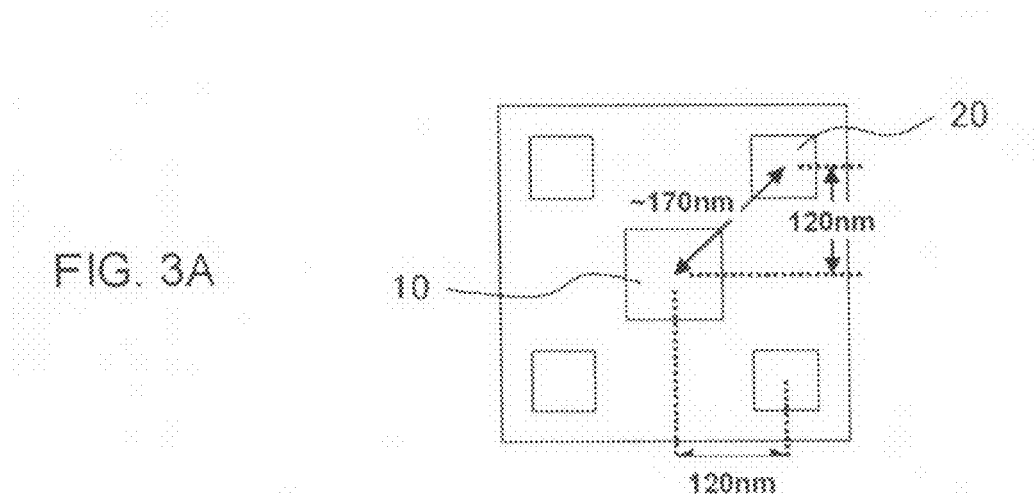
FIG. 3A is a plan view showing a photomask according to the first working example of the present invention.

FIG. 3A is a plan view showing a photomask according to the first working example of the present invention. The photomask includes, as the photomask 1 shown in FIG. 1, totally four assist openings 20 at the direction of 45° and 135°. The distance between the central point of the main opening 10 and that of the assist opening 20 is approx. 170 nm. The main opening 10 is a square of 90 nm in side length, and the assist openings 20 are squares of 70 nm in side length. The shape and dimensions of the main opening 10 and the assist openings 20 are the same in FIGS. 4A, 5A, 7A and 8A to be subsequently described.

Figure 3B:
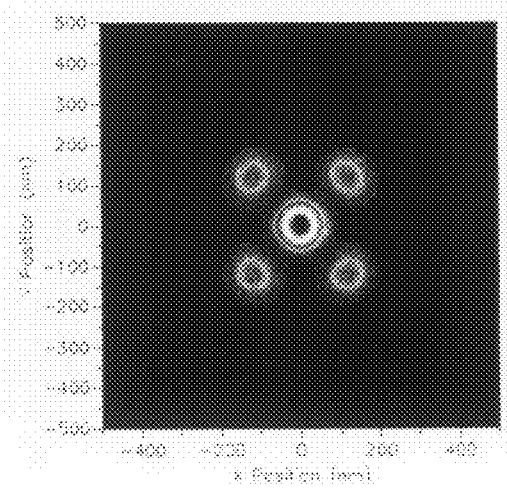
FIG. 3B is a graphic diagram showing a result of aerial image simulation utilizing the dipole illumination light, with respect to the photomask shown in FIG. 3A.

FIG. 3B is a graphic diagram showing a result of aerial image simulation utilizing the dipole illumination light, with respect to the photomask shown in FIG. 3A. Upon calculating the NILS based on this result, the value of 1.413 was obtained at the direction of 0° (first direction), 1.424 at 90° (second direction), and 1.467 at 45° (third direction). In an actual semiconductor manufacturing process, it is desirable that the NILS is 1.4 or higher.

Figure 3C:
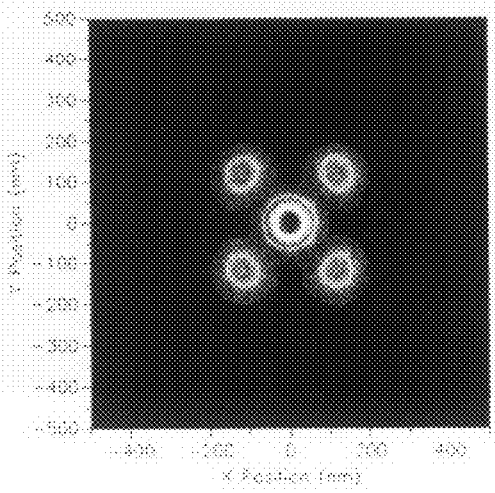
FIG. 3C is a graphic diagram showing a result of the aerial image simulation utilizing the annular illumination light, with respect to the photomask shown in FIG. 3A.

FIG. 3C is a graphic diagram showing a result of the aerial image simulation utilizing the annular illumination light, with respect to the photomask shown in FIG. 3A. The NILS calculated based on this result was 1.373 at the direction of 45°.

Figure 4A:
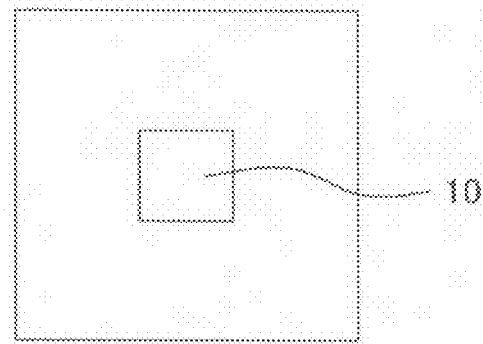
FIG. 4A is a plan view showing a photomask according to the first comparative example.

FIG. 4A is a plan view showing a photomask according to the first comparative example. The photomask solely includes the main opening 10, out of the main opening 10 and the assist openings 20.

Figure 4B:
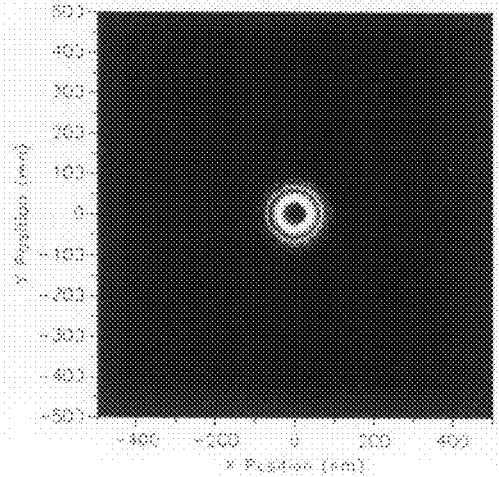
FIG. 4B is a graphic diagram showing a result of the aerial image simulation utilizing the dipole illumination light, with respect to the photomask shown in FIG. 4A.

FIG. 4B is a graphic diagram showing a result of the aerial image simulation utilizing the dipole illumination light, with respect to the photomask shown in FIG. 4A. The NILS calculated based on this result was 1.199 at the direction of 0°, and 1.277 at 90°.

Figure 4C:
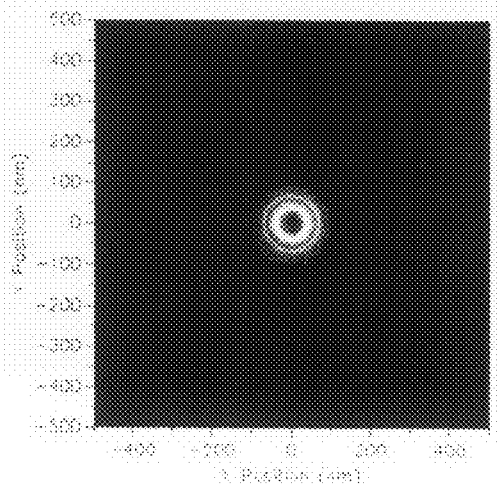
FIG. 4C is a graphic diagram showing a result of the aerial image simulation utilizing the annular illumination light, with respect to the photomask shown in FIG. 4A.

FIG. 4C is a graphic diagram showing a result of the aerial image simulation utilizing the annular illumination light, with respect to the photomask shown in FIG. 4A. The NILS calculated based on this result was 1.238.

Figure 5A:
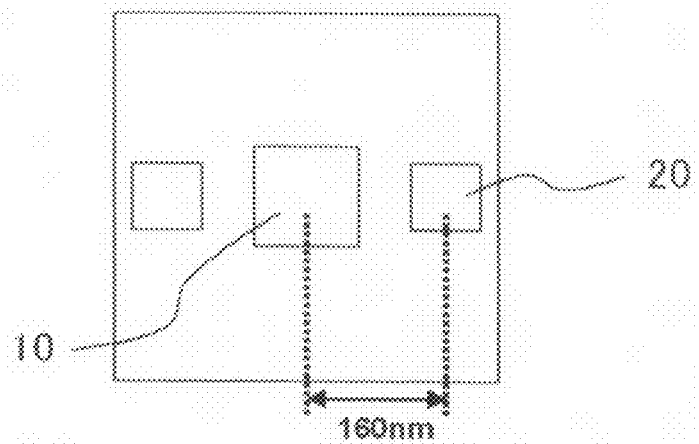
FIG. 5A is a plan view showing a photomask according to the second comparative example.

FIG. 5A is a plan view showing a photomask according to the second comparative example. The photomask includes two assist openings 20 at the direction of 0°. The distance between the central point of the main opening 10 and that of the respective assist opening 20 is 160 nm.

Figure 5B:
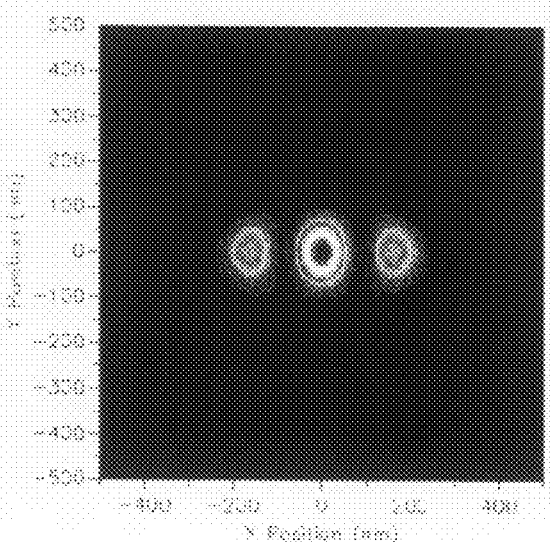
FIG. 5B is a graphic diagram showing a result of the aerial image simulation utilizing the dipole illumination light, with respect to the photomask shown in FIG. 5A.

FIG. 5B is a graphic diagram showing a result of the aerial image simulation utilizing the dipole illumination light, with respect to the photomask shown in FIG. 5A. The NILS calculated based on this result was 1.807 at the direction of 0°, and 1.104 at 90°.

Figure 6A:
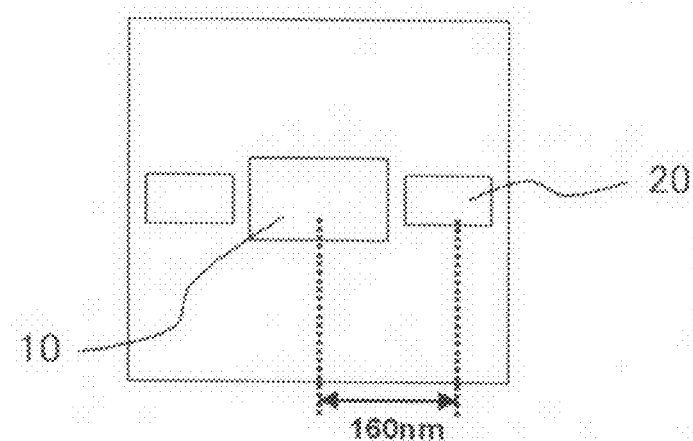
FIG. 6A is a plan view showing a photomask according to the third comparative example.

FIG. 6A is a plan view showing a photomask according to the third comparative example. The photomask includes two assist openings 20 at the direction of 0°. However, the main opening 10 is a rectangle having a short side of 60 nm and a long side of 120 nm, and the assist openings 20 are rectangles having a short side of 50 nm and a long side of 90 nm. The distance between the central point of the main opening 10 and that of the respective assist opening 20 is 160 nm.

Figure 6B:
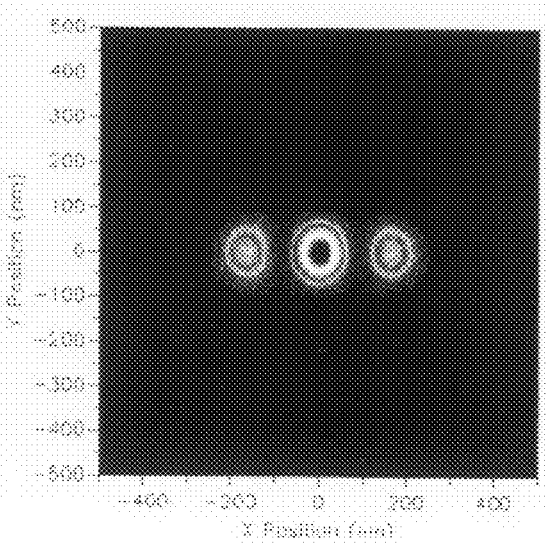
FIG. 6B is a graphic diagram showing a result of the aerial image simulation utilizing the dipole illumination light, with respect to the photomask shown in FIG. 6A.

FIG. 6B is a graphic diagram showing a result of the aerial image simulation utilizing the dipole illumination light, with respect to the photomask shown in FIG. 6A. The NILS calculated based on this result was 1.502 at the direction of 0°, and 1.151 at 90°.

Figure 7A:
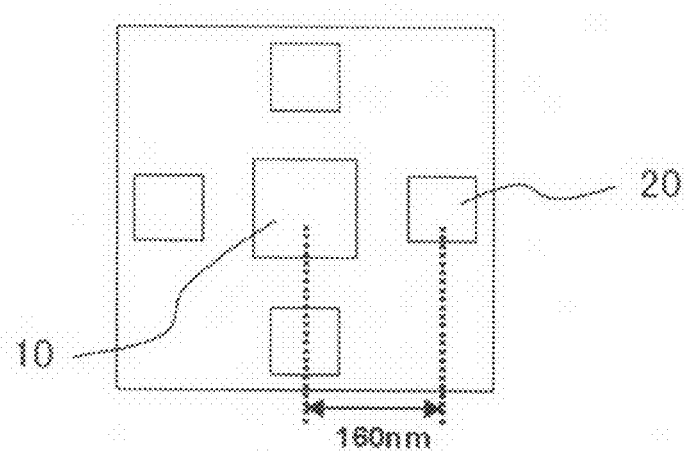
FIG. 7A is a plan view showing a photomask according to the fourth comparative example.

FIG. 7A is a plan view showing a photomask according to the fourth comparative example. The photomask includes four assist openings 20 at the direction of 0° and 90°. The distance between the central point of the main opening 10 and that of the respective assist opening 20 is 160 nm.

Figure 7B:
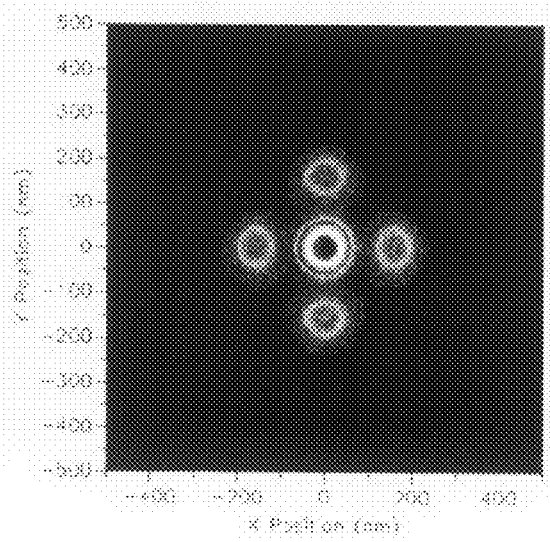
FIG. 7B is a graphic diagram showing a result of the aerial image simulation utilizing the annular illumination light, with respect to the photomask shown in FIG. 7A.

FIG. 7B is a graphic diagram showing a result of the aerial image simulation utilizing the annular illumination light, with respect to the photomask shown in FIG. 7A. The NILS calculated based on this result was 1.364.

Figure 8A:
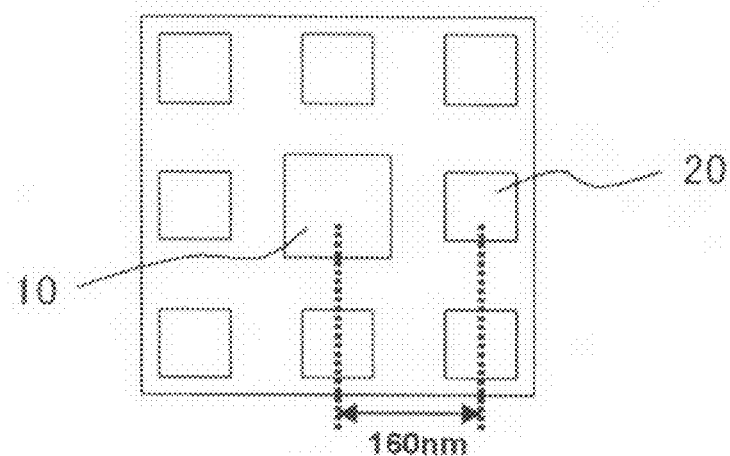
FIG. 8A is a plan view showing a photomask according to the fifth comparative example.

FIG. 8A is a plan view showing a photomask according to the fifth comparative example. The photomask includes totally eight assist openings 20 at the direction of 0°, 45°, 90° and 135°. The distance between the central point of the main opening 10 and that of the respective assist opening 20 located at 0° and 90° is 160 nm. The distance between the central point of the main opening 10 and that of the respective assist opening 20 located at 45° and 135° is approximately 230 nm.

Figure 8B:
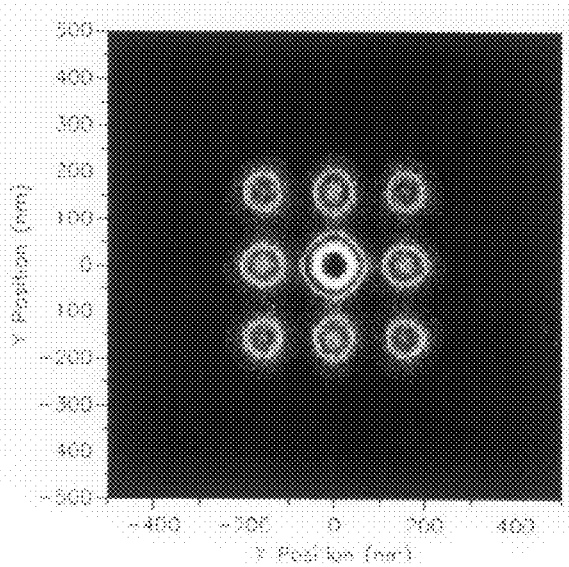
FIG. 8B is a graphic diagram showing a result of the aerial image simulation utilizing the annular illumination light, with respect to the photomask shown in FIG. 8A.

FIG. 8B is a graphic diagram showing a result of the aerial image simulation utilizing the annular illumination light, with respect to the photomask shown in FIG. 8A. The NILS calculated based on this result was 1.227.

As is understood in view of the foregoing results, all the NILS values at the direction of 0°, 45° and 90° obtained with respect to FIG. 3B representing the working example of the present invention are higher than the NILS values with respect to FIGS. 3C, 4B, 4C, 7B and 8B representing the comparative examples. Although the NILS values at the direction of 0° from FIGS. 5B and 6B representing the comparative examples are higher than that of FIG. 3B, the NILS values at the direction of 90° of FIGS. 5B and 6B are far lower than that of FIG. 3B. When the NILS at a specific direction is thus much lower, a main opening and an assist opening, or assist openings adjacently located at that direction may be short-circuited.

Figure 9:
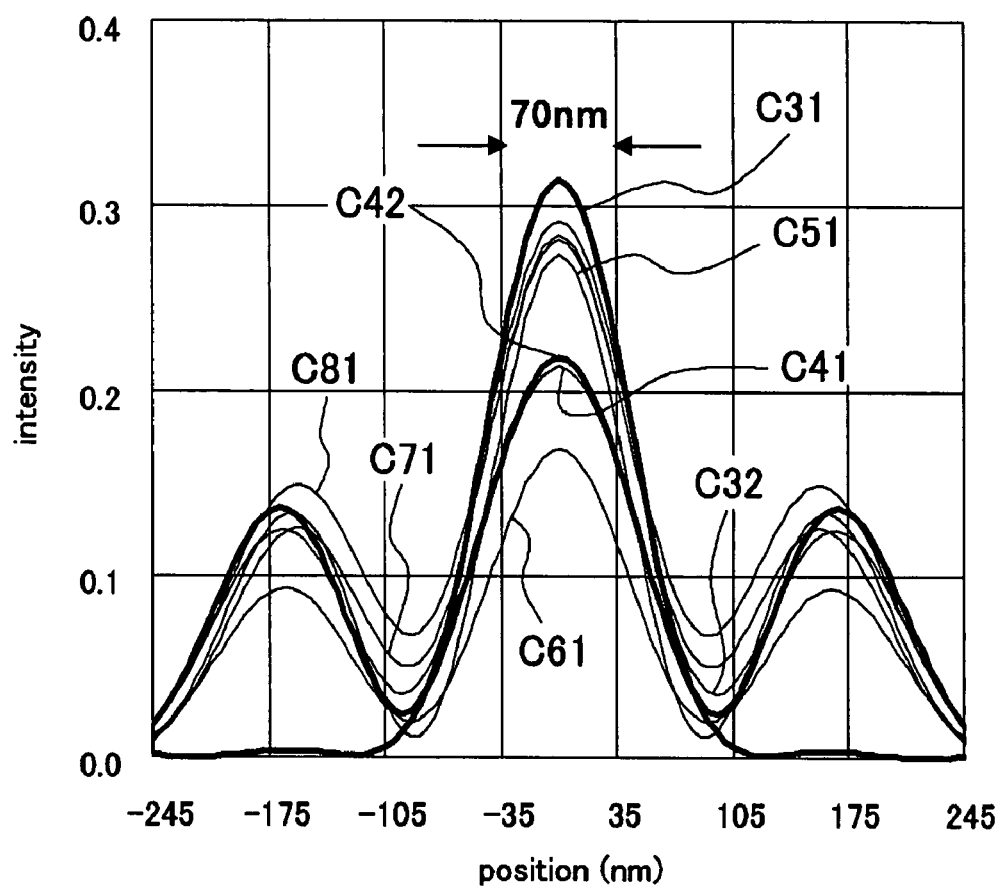
FIG. 9 is a graph showing intensity profiles along the location direction of the assist openings, based on the result of the aerial image simulation.
Figure 10:
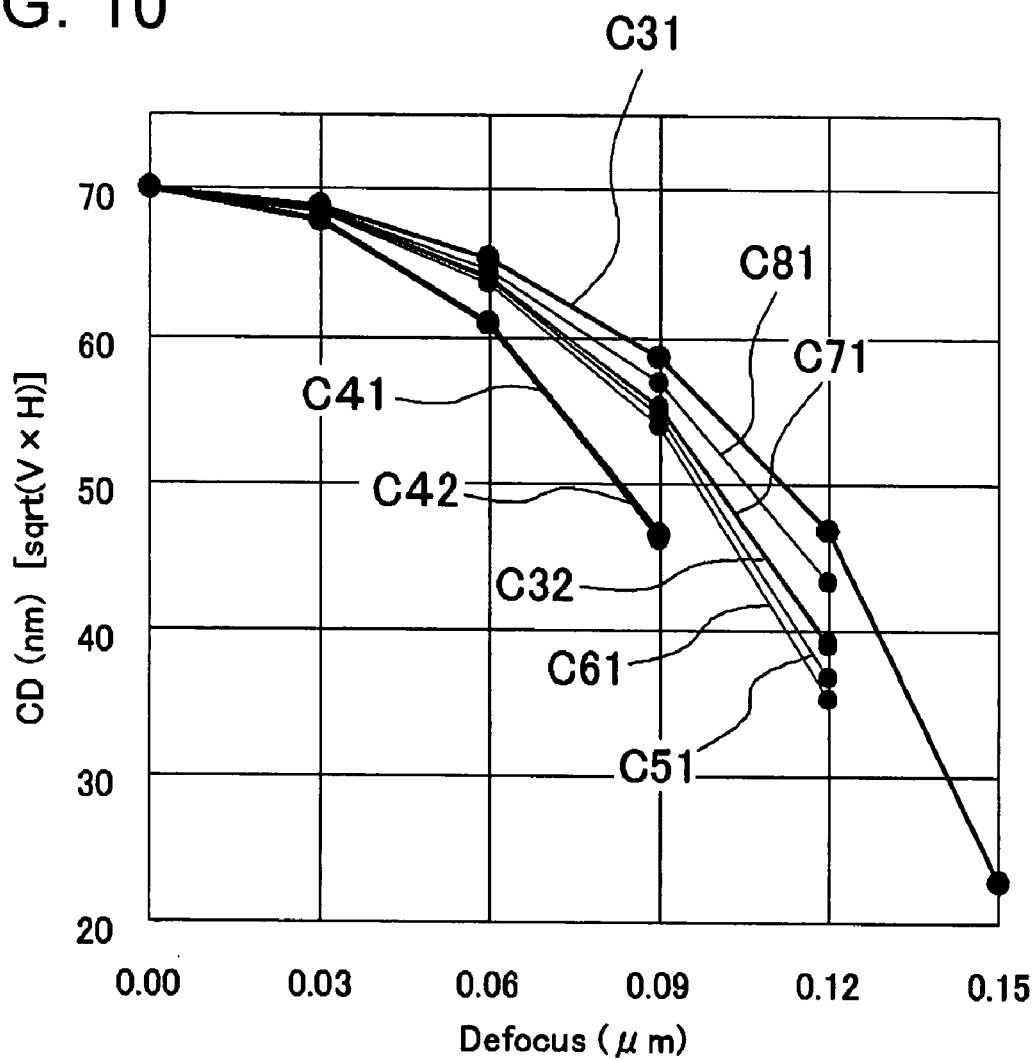
FIG. 10 is a graph showing focus margins based on the result of the aerial image simulation.

FIG. 9 is a graph showing intensity profiles along the location direction of the assist openings, based on the result of the foregoing aerial image simulation. FIG. 10 is a graph showing focus margins based on such result. In these graphs, lines C31, C32, C41, C42, C51, C61, C71 and C81 correspond to FIGS. 3B, 3C, 4B, 4C, 5B, 6B, 7B and 8B, respectively.

As is apparent from the graph of FIG. 9, a sufficient transference margin is secured. The transference margin herein referred to means such illumination light intensity range as is necessary for the main opening to be transferred without allowing the assist opening to be transferred. Also, as is understood from FIG. 10, a maximal focus margin of 0.17 μm was obtained when the exposure was performed with the dipole illumination light through the photomask of FIG. 3A (Ref. line C31). On the other hand, the focus margin in the case of performing the exposure with the annular illumination light through the photomask of FIG. 4A (Ref. line C42) was 0.12 μm.

Figure 11:
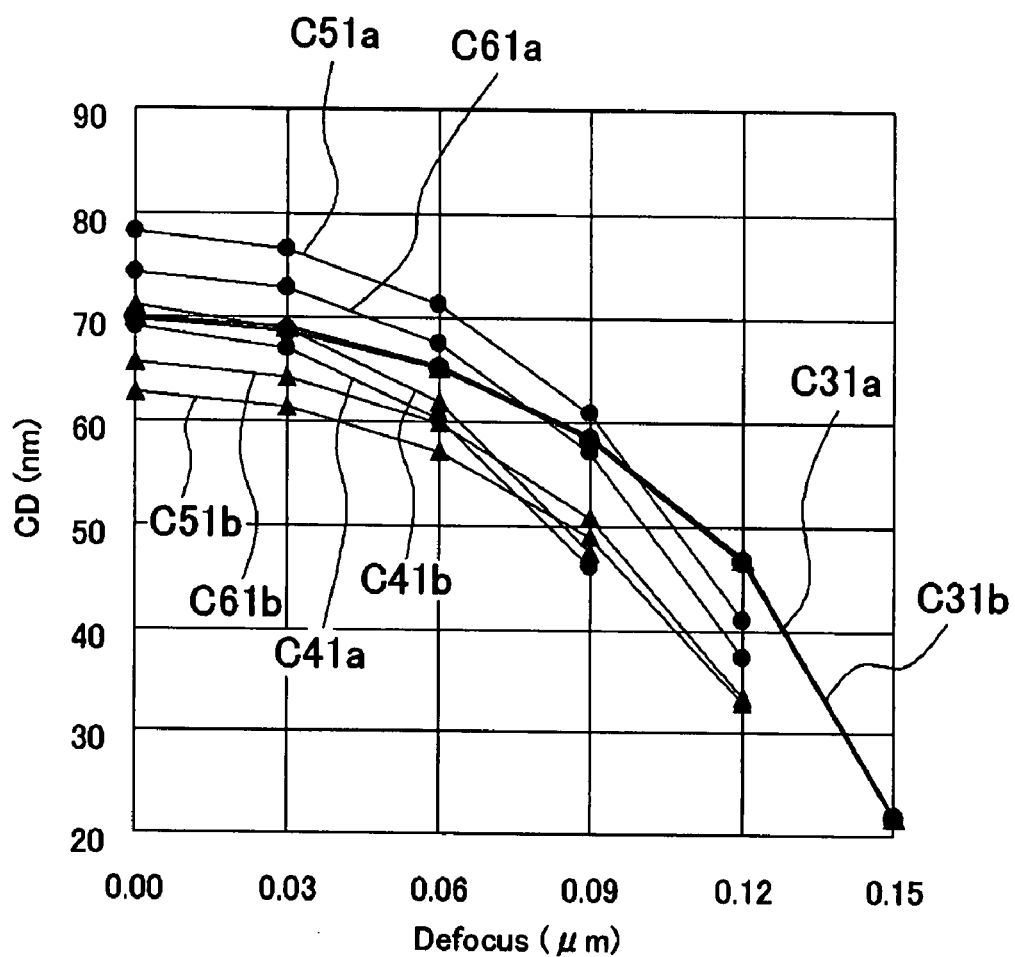
FIG. 11 is a graph for comparison of roundness of hole patterns to be exposed, between the working example and the comparative example.
Figure 12:
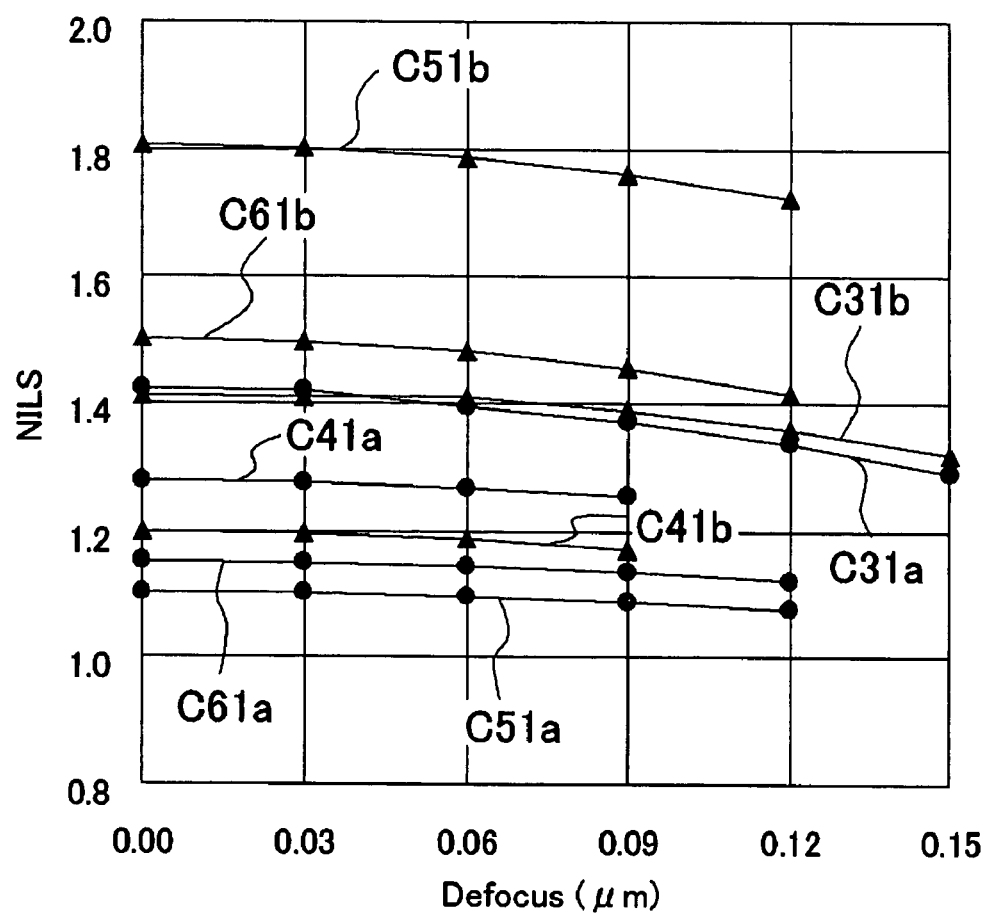
FIG. 12 is a graph for comparison of roundness of hole patterns to be exposed, between the working example and the comparative example.

Referring now to FIGS. 11 and 12, comparison will be made between the working example and the comparative examples, with respect to the roundness of the hole pattern to be exposed. FIG. 11 is a graph showing the focus margin, and FIG. 12 is a graph showing the NILS. In these graphs, lines C31a and C31b represent the results with respect to the vertical direction (90°) and the horizontal direction (0°) of FIG. 3B, respectively. Likewise, lines C41a and C41b represent the results with respect to the vertical direction and the horizontal direction of FIG. 4B, lines C51a and C51b the vertical direction and the horizontal direction of FIG. 5B, and lines C61a and C61b the vertical direction and the horizontal direction of FIG. 6B, respectively.

As is apparent from the graphs of FIGS. 11 and 12, upon performing the exposure with the dipole illumination light, it was through the photomask of FIG. 3A (Ref. lines C31a and C31b) that a minimal difference in dimension as well as in NILS was obtained between the vertical direction and the horizontal direction. Moreover, in this case the difference in both dimension and NILS was close to zero. This indicates that a generally perfect circle can be reproduced. In contrast, upon performing the exposure with the dipole illumination light through the photomask of FIG. 5A (Ref. lines C51a and C51b), the difference in dimension (CD) between the vertical and the horizontal direction was 15.6 nm. Also, upon performing the exposure with the dipole illumination light through the photomask of FIG. 6A (Ref. lines C61a and C61b), the difference in dimension between the vertical and the horizontal direction was 8.7 nm. Thus, when the assist openings were located at the direction of 0° under the dipole illumination, the circle was evidently deformed into an ellipse (Ref. FIGS. 5B and 6B).

Second Embodiment

FIG. 13 is a plan view showing a photomask according to the second embodiment of the present invention. The photomask 2 is to be used for exposure of a semiconductor wafer with dipole illumination light, and includes a plurality of main openings 10 and a plurality of assist openings 20. Specifically, the photomask 2 includes nine pieces of main openings 10 and four pieces of assist openings 20.

The respective main openings 10 are similarly configured to that shown in FIG. 1. The respective assist openings 20 are similarly configured to the assist openings 22, 24, 26, 28 shown in FIG. 1. In this embodiment also, the assist openings 20 are located so that the central point thereof is deviated from both of the first and the second straight line. Also, the assist openings 20 are located on the third or the fourth straight line.

The definition of the first, the second, the third and the fourth straight line is the same as in the foregoing embodiment. However, in the case where a plurality of main openings 10 are provided as in this embodiment, the first straight line refers to a straight line parallel to the first direction, and passing the central point of the main opening 10 closest to the respective assist opening 20. This also applies to the second, the third and the fourth straight line. For example, with respect to the assist opening 20 located at the upper right side in FIG. 13, the closest main openings 10 to that assist opening 20 are the four main openings 10 surrounding the same assist opening 20.

The second embodiment of the exposure method according to the present invention represents the case of irradiating the semiconductor wafer with the dipole illumination light through such photomask 2.

In this embodiment as well, since the central points of all the assist openings 20 are deviated from both of the first and the second straight line, the extreme degradation in resolution at a specific direction can be prevented. In addition, this embodiment provides the similar advantages to those offered by the foregoing embodiment.

Referring to FIGS. 14A through 15C, results of simulation performed to prove the effects of this embodiment will be described. In this simulation the light sources shown in FIGS. 2A and 2B were employed for exposure of semi-dense holes through a binary mask with illumination light of 157 nm in wavelength, and 0.8 in numerical aperture (NA). The pitch between the holes is 240 nm, and the size of each hole is 70 nm.

FIG. 14A is a plan view showing a photomask according to the second working example of the present invention. The layout of the main openings 10 and the assist openings 20 is the same as the photomask 2. The distance between the central points of main openings 10 closest to each other is 240 nm. The distance between the central point of one of the main openings 10 and that of the assist opening 20 closest thereto is approximately 170 nm. The main opening 10 is a square of 90 nm in side length, and each of the assist openings 20 is a square of 70 nm in side length.

FIG. 14B is a graphic diagram showing a result of aerial image simulation utilizing the dipole illumination light, with respect to the photomask shown in FIG. 14A. The NILS calculated based on this result was 1.528.

FIG. 14C is a graphic diagram showing a result of aerial image simulation utilizing the annular illumination light, with respect to the photomask shown in FIG. 14A. The NILS calculated based on this result was 1.287.

Figure 15A:
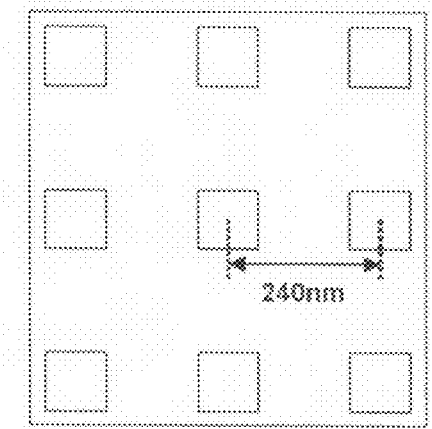
FIG. 15A is a plan view showing a photomask according to the sixth comparative example.

FIG. 15A is a plan view showing a photomask according to the sixth comparative example. This photomask solely includes the main openings, out of the main openings 10 and the assist openings 20. As the photomask shown in FIG. 14A, a plurality of main openings 10 are provided. The distance between the central points of main openings 10 closest to each other is also 240 nm. Each main opening 10 is a square of 90 nm in side length.

Figure 15B:
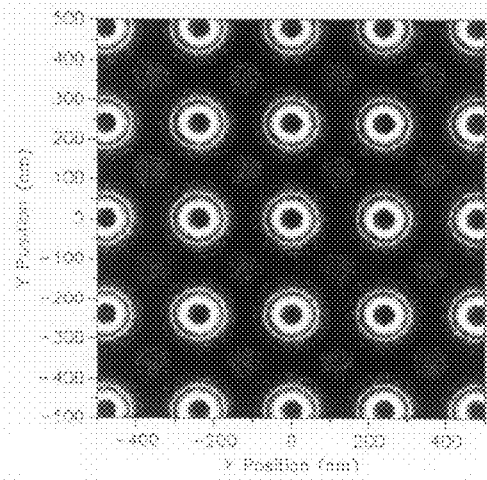
FIG. 15B is a graphic diagram showing a result of the aerial image simulation utilizing the dipole illumination light, with respect to the photomask shown in FIG. 15A.

FIG. 15B is a graphic diagram showing a result of the aerial image simulation utilizing the dipole illumination light, with respect to the photomask shown in FIG. 15A. The NILS calculated based on this result was 1.298.

Figure 15C:
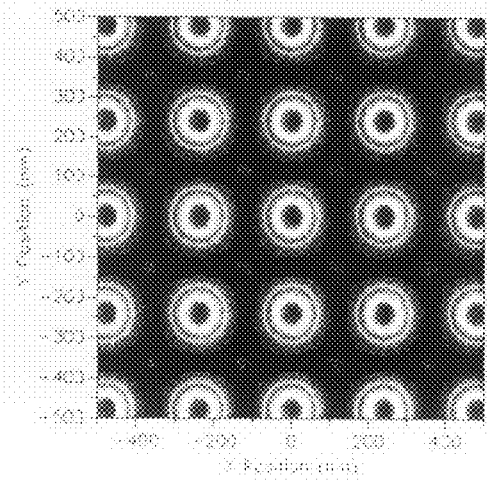
FIG. 15C is a graphic diagram showing a result of the aerial image simulation utilizing the annular illumination light, with respect to the photomask shown in FIG. 15A.

FIG. 15C is a graphic diagram showing a result of the aerial image simulation utilizing the annular illumination light, with respect to the photomask shown in FIG. 15A. The NILS calculated based on this result was 1.100.

As is apparent from those results, it was through the photomask of FIG. 14A that a maximal NILS was obtained, upon performing the exposure with dipole illumination light.

The photomask and the exposure method according to the present invention are not limited to the foregoing embodiment, but various modifications may be made. To cite a few examples, although the assist openings are located at the direction of 45° and 135° in the foregoing embodiments, the assist openings may be located at a different direction from 45° or 135°, as long as the central point thereof is deviated from both of the first and the second straight line.

Also, while the foregoing embodiments represent the case where four pieces of assist openings are provided, any number of assist openings may be provided, as long as it is 1 or more.

Further, while the embodiments represent the case where the assist opening is of a square shape, the assist opening may be formed in a different shape. Examples of the shape other than square include a rectangle, a circle and an ellipse.

It is apparent that the present invention is not limited to the above embodiment, and may be modified and changed without departing from the scope and spirit of the invention.

What is claimed is:

1. A photomask to be used for exposure of a semiconductor wafer with dipole illumination light, comprising:

a main opening provided so as to correspond to a predetermined pattern to be formed on said semiconductor wafer and to be transferred to said semiconductor wafer; and a subresolution assist opening provided around said main opening;

wherein, when a direction among in-plane directions of said photomask that is parallel and vertical to an alignment direction of an effective light source distribution of said dipole illumination light is respectively defined as a first and a second direction, said assist opening is located so that a central point of said assist opening is deviated from both of a first straight line parallel to said first direction and passing a central point of said main opening and a second straight line parallel to said second direction and passing said central point of said main opening.

2. The photomask according to claim 1, wherein, when a direction among said in-plane directions of said photomask that makes 45° and 135° with respect to said alignment direction of said effective light source distribution of said dipole illumination light is respectively defined as a third and a fourth direction, said assist opening is located on a third straight line parallel to said third direction and passing said central point of said main opening, or on a fourth straight line parallel to said fourth direction and passing said central point of said main opening.

3. The photomask according to claim 2, wherein said assist opening includes a first and a second assist opening located on said third straight line so as to oppose each other across said central point of said main opening, and a third and a fourth assist opening located on said fourth straight line so as to oppose each other across said central point of said main opening.

4. The photomask according to claim 1, wherein a plurality of said main openings and a plurality of said assist openings are provided;

said first straight line is a straight line parallel to said first direction and passing said central point of said main opening closest to each of said assist openings; and said second straight line is a straight line parallel to said second direction and passing said central point of said main opening closest to each of said assist openings.

5. The photomask according to claim 2, wherein a plurality of said main openings and a plurality of said assist openings are provided;

said first straight line is a straight line parallel to said first direction and passing said central point of said main opening closest to each of said assist openings;

said second straight line is a straight line parallel to said second direction and passing said central point of said main opening closest to each of said assist openings;

said third straight line is a straight line parallel to said third direction and passing said central point of said main opening closest to each of said assist openings; and said fourth straight line is a straight line parallel to said fourth direction and passing said central point of said main opening closest to each of said assist openings.

6. A method of exposing a semiconductor wafer with dipole illumination light, comprising irradiating said semiconductor wafer with said dipole illumination light through said photomask according to claim 1.

* * * * *